United States Patent [19]

Koh et al.

[11] Patent Number: 5,149,671

[45] Date of Patent: Sep. 22, 1992

[54] METHOD FOR FORMING MULTILAYER INDIUM BUMP CONTACT

[75] Inventors: Wei Koh, Irvine; Wayne D. Kuipers, Mission Viejo, both of Calif.

[73] Assignee: Grumman Aerospace Corporation, Bethpage, N.Y.

[21] Appl. No.: 620,734

[22] Filed: Dec. 3, 1990

[51] Int. Cl.$^5$ .................................... H01L 21/44
[52] U.S. Cl. .................................... 437/183; 437/189; 437/944; 148/DIG. 100
[58] Field of Search ................ 437/183, 189, 944; 148/DIG. 100

[56] References Cited

U.S. PATENT DOCUMENTS

| | | | |
|---|---|---|---|
| 3,603,691 | 9/1971 | Hamilton | 356/132 |
| 3,997,963 | 12/1976 | Riserman | 437/183 |
| 4,067,104 | 1/1978 | Tracy | 437/183 |
| 4,205,099 | 5/1980 | Jones et al. | 437/183 |
| 4,551,629 | 11/1985 | Carson et al. | 250/578 |
| 4,617,160 | 10/1986 | Belanger et al. | 264/40.1 |
| 4,792,672 | 12/1988 | Schmitz | 250/211 |
| 4,818,712 | 4/1989 | Tully | 437/944 |
| 4,866,008 | 9/1989 | Brighton et al. | 437/183 |
| 4,930,001 | 5/1990 | Williams | 437/183 |
| 4,950,623 | 8/1990 | Dishon | 437/183 |

FOREIGN PATENT DOCUMENTS

| | | | |
|---|---|---|---|
| 0316912 | 5/1989 | European Pat. Off. | 437/183 |
| 54-105962 | 8/1979 | Japan | 437/183 |
| 59-067652 | 4/1984 | Japan | 437/183 |
| 62-276835 | 12/1987 | Japan | 437/183 |
| 63-220549 | 9/1988 | Japan | 437/183 |
| 63-261857 | 10/1988 | Japan | 437/183 |

*Primary Examiner*—Brian E. Hearn
*Assistant Examiner*—Laura M. Holtzman
*Attorney, Agent, or Firm*—Stetina and Brunda

[57] ABSTRACT

A method for forming multilayer bump contacts for use in flip-chip bump bonding and the like. The method comprises applying a base layer to a substrate and then applying a malleable conductive layer to the base layer. In a first embodiment, individual bump contacts are formed by removing portions of the base layer and malleable layer such that a plurality of bump contacts are formed. In a second embodiment a photoresist and etching process is used. The need to precisely align a mark to define the position of the malleable layer relative to the base layer is eliminated since the positions of the malleable layer and the base layer are defined simultaneously in both embodiments. Thus, the number of process steps is reduced, yield is increased, and alignment accuracy is improved.

2 Claims, 4 Drawing Sheets

METHOD FOR FORMING MULTILAYER INDIUM BUMP CONTACT

FIELD OF THE INVENTION

The present invention relates generally to methods for interfacing integrated circuit modules and more particularly to a method for forming bump contacts for use in flip-chip bump bonding and the like.

BACKGROUND OF THE INVENTION

The use of indium bumps in flip-chip bump bonding for high-density interconnection in integrated circuitry, such as between infrared detector arrays and signal-processing modules, is well known. Indium bumps 30 to 40 microns in diameter and spaced approximately 100 microns apart are typically formed in arrays upon two integrated circuit substrate surfaces to be electrically connected such that the indium bumps will fuse when brought into contact and forced together. Each indium bump is connected to a conductive conduit which provides electrical communication to integrated circuitry formed upon the substrate. For example, infrared detector arrays containing a number of detector pixels (e.g. 8×128 or 64×64) are often formed upon one semiconductor substrate and must be electrically connected to signal conditioning electronics formed upon another semiconductor substrate.

The indium bumps are conventionally formed upon the substrate surfaces by either electroplating or vapor deposition. A photo resist process is used to delineate the indium bumps. In practicing this process the yield for bumps formed near the perimeter of the substrate is typically lower than that for bumps formed near the center. This is due to difficulties which occur during the lift-off process.

Because of the difficulty of bonding the malleable indium directly to the substrate surface, conductive metal pads are first formed thereon. Very tight alignment tolerances (e.g. within +/− 5 microns) must be maintained in the bump formation process to assure that the bumps are properly positioned upon the metal base pads. Proper positioning is achieved through precisely aligning a mask to be used in the photoresist process. Thus, proper alignment of the mask is crucial to the positioning of the bump relative to the base pad. Problems occurring during the bump formation process further reduce the yield. Thus, the overall yield of the indium bump contact formation process is very low.

Some tolerance for slight misalignment of the malleable layer to the base layer must be provided in the prior art since it is not possible to exactly align the mask during the malleable layer formation process. This tolerance is achieved by forming each malleable layer somewhat smaller in area than its corresponding conductive base pad. Thus, a slight misalignment will not cause the malleable layer to overhang the base pad and be partially formed directly upon the substrate. This margin for alignment error thus makes alignment slightly less critical, but it also reduces the surface area of the malleable layer and thus increases the probability of slipping.

Therefore, because of their limited surface area, prior art contact bumps are susceptible to slippage during flip-chip bump bonding. Slippage may occur when two similar-sized bumps are imperfectly aligned. Imperfect alignment results when the bumps are not faced center-to-center during the bump bonding process. Slippage results in poor contact of those indium bumps which fuse and can result in lack of contact among some bumps due to alignment tolerances. That is, the slippage results in an overall misalignment, thus making the alignment of each individual bump particularly crucial. It is possible that the overall misalignment may cause one or more contact bumps to be sufficiently misaligned such that no contact is made at all.

Although such prior art indium contact bumps have proven generally suitable for their intended purposes, they possess inherent deficiencies which detract from their overall effectiveness in the marketplace. In view of the shortcomings of the prior art, it would be desirable to provide a method for forming bump contacts which is simple to practice and which has a higher yield than contemporary processes. It would also be desirable to provide a process for fabricating indium contact bumps having a greater surface area than prior art bump contacts without increasing the overall size of the array.

SUMMARY OF THE INVENTION

The present invention comprises a method for forming bump contacts for use in flip-chip bump bonding and the like. The method comprises applying a conductive base layer to a substrate and then applying a malleable conductive layer to the base layer. In a first embodiment, bump contacts are formed by removing portions of the base layer and malleable layer simultaneously such that the shape and locations of the bump contacts are thereby defined. In a second embodiment the base layer and malleable layer are formed such that the shape and locations of the bump contacts are defined through the use of a single photoresist.

The need to precisely align a photo resist mask to define the position of the malleable layer relative to the base layer, as is done in the prior art, is eliminated since the positions of the malleable layer and the base layer are defined simultaneously in both embodiments of the present invention. Thus, the number of process steps is reduced, yield is increased, and alignment accuracy is improved.

In both embodiments of the process of the present invention, the malleable layer substantially covers the conductive base layer. This is possible since the two layers defining each of the bump contacts are delineated simultaneously either by laser scribing or through the use of a single photoresist. Thus, the malleable layer does not have to be aligned to the conductive base layer. The malleable layer can therefore completely cover the conductive base layer. No margin for alignment error is required as is necessary in the prior art. That is, there is no need to be concerned about the possibility of forming a portion of the malleable layer such that it overhangs the conductive base layer. By completely covering the conductive base layer, the surface area of the malleable layer is increased and the probability of slippage is reduced.

In the first embodiment of the present invention the base layer and malleable layer are selectively removed to define bump contacts by using laser scribing. A first conductive layer is formed upon the substrate. This first conductive layer will be used to form the conductive base pads of the indium bump contacts. Next, a second conductive layer comprised of indium or another suitable malleable material is formed upon the first conductive layer. Thus, the two conductive layers which will ultimately form the indium bump contacts initially cover substantially the entire upper surface of the substrate. The unwanted portions of the two conductive layers are removed such that only those portions defining the indium bump contacts remain.

Although those skilled in the art will recognize that various methods are suitable for removing corresponding portions of the first and second conductive layers such that a plurality of separate contact bumps are defined, the preferred process for accomplishing this in the first embodiment of the present invention is laser scribing. A microprocessor controlled laser may be programmed to remove the undesired portions of the two conductive layers. This is typically accomplished by programming an X-Y table upon which the substrate is mounted to move appropriately such that incident laser radiation ablates the unwanted portions of the malleable and conductive base layers.

In a second embodiment of the present invention a photo resist and etching process is used to define the bump contacts. Prior to forming the two layers of conductive material upon the substrate, a layer of resist material is formed upon the substrate. The layer of resist material is formed to have uncovered areas which define the shape and position of the indium bumps to be formed.

After the layer of resist material is formed upon the substrate, the first conductive layer is formed upon the substrate. The presence of the resist material permits the first conductive layer to be formed only in the uncovered areas such that the base pads for the indium bump contacts are thus formed. Next the second conductive layer of a malleable material is formed upon the first conductive layer to complete the formation of the indium bump contacts. The resist is then removed, thus leaving only the indium bump contacts upon the surface of the substrate.

The process of the present invention substantially reduces problems which occur during photoresist lift-off. The lift-off process is completely eliminated in the first embodiment and substantially simplified in the second embodiment of the present invention. The use of laser scribing in the first embodiment of the present invention eliminates the requirement for a photoresist and therefore eliminates the requirement for photoresist lift-off. Liftoff off occurs only one time during the process of the second embodiment of the present invention. This is because only a single photoresist is required in the practice of the process of the second embodiment. In the second embodiment of the present invention lift-off occurs only after the complete formation of the bump contacts. Thus, the structural integrity of the bump contacts is at its maximum before lift-off occurs, whereas, in the prior art, lift-off occurs twice and the first occurrence is prior to the formation of the indium bumps upon the base pads. Thus, lift-off occurs in the prior art at a point in the process when the base pads are not protected by the indium layer and are therefore comparatively structurally weak. This increases the probability of damage occurring to the base pads during the lift-off process.

DETAILED DESCRIPTION OF THE PREFERRED EMBODIMENT

The detailed description set forth below in connection with the appended drawings is intended as a description of the presently preferred embodiment of the invention, and is not intended to represent the only form in which the present invention may be constructed or utilized. The description sets the functions and sequences of steps for constructing and operating the invention in connection with the illustrated embodiments. It is to be understood, however, that the same or equivalent functions and sequences may be accomplished by different embodiments that are also intended to be encompassed within the spirit and scope of the invention.

The multilayer bump contacts of the present invention and a method for forming the same are illustrated in FIGS. 2-4, 6A-6D, and 7A-7G. FIGS. 1 and 5A-5I depict prior art bumps and a method for forming the same, respectively.

While the method for forming multilayer bump contacts of the present invention may be used in many applications, its use for connecting an infrared detector array to signal conditioning electronics is illustrated in connection with the description of a preferred embodiment. Such illustration is by way of example only and not by way of limitation.

Figure 1:
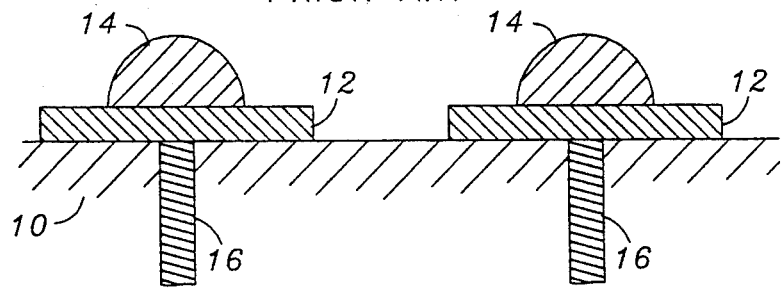
FIG. 1 is a cross-sectional side view of prior art indium bumps and base pads formed upon a substrate surface and having a conductive conduit extending therefrom into the substrate.

Referring now to FIG. 1, a prior art indium bump and base pad configuration as typically found in contemporary devices is depicted. The indium bump 14 is disposed upon a metal base pad 12 which in turn is formed upon a substrate 10. The substrate 10 is typically formed of a semiconductor material such as single crystalline silicon. Those skilled in the art will recognized that other materials such as glass or sapphire are likewise suitable. Leads 16 extend through the substrate 10 to electrically connect each base pad 12 to signal conditioning electronics or the like.

Each indium bump 14 is typically 30-40 microns in diameter. Indium bumps are typically spaced 100 microns apart, center-to-center. Contemporary indium bumps are formed on the substrate surface by utilizing conventional photoresist techniques to either electroplate or vapor deposit the base pads 12 and the indium bumps 14 in two separate steps, each step utilizing a separate mask. First a mask is used in the photoresist delineation of the conductive base pads 12. Next a different mask is used in the photoresist delineation of the malleable indium bumps 14. The alignment of the mask used in the photoresist delineation of the indium bumps 14 is particularly crucial. Any misalignment of the mask results in an off-center formation of the indium bump 14 relative to the base pad 12. The indium bumps 14 must be positioned with a tolerance of approximately +/−5 microns. The requirement for such a tight alignment tolerance reduces the yield of the fabrication process and increases the difficulty and care required to accomplish the process. The use of two separate marks makes it necessary to form the indium bumps 14 such that they have less surface are than the base pads 12 to prevent overhang due to slight misalignment Referring now to FIG. 2, the method of the present invention replaces the low-yield and complicated indium bump and base pad formation process of the prior art. The fabrication process is simplified and yield is increased by eliminating the difficult step of aligning the indium bump photoresist mask to the base pads.

Figure 2:
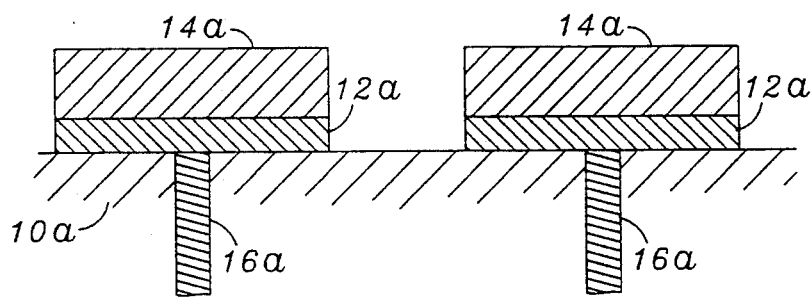
FIG. 2 is a cross-sectional side view of indium bumps formed according to the process of the present invention.

Two embodiments of the present invention are provided, neither of which requires the precise alignment of a photoresist mask. In the first embodiment the metal base layer and indium bump layer are formed upon the substrate and the contact bumps are then delineated by utilizing a laser or the like to remove unwanted overlapping portions of the metal base material and indium such that the indium contacts of FIG. 2 are formed. In the second embodiment a single photoresist is formed upon the substrate using a non-critically aligned mask. The single mask is then used to form both the metal base layer 12a and the indium bump layer 14a, thus eliminating the requirement for separate base layer 12a and bump layer 14a masks.

Indium bump contact pads formed according to either the first or second embodiment of the process of the present invention have an increased surface area over those of the prior art since substantially the entire upper surface of the base layer 12a is covered with indium to form the bump 14a. That is, the surface area of the indium or second layer is substantially equal to the surface area of the base or first layer. This increased surface area decreases the required alignment tolerance for flip-chip bump bonding and also reduces the likelihood slippage occurring during the bonding process. Thus, the process of the present invention provides a simplified method having an increased yield and providing a superior product. The per unit cost of each item manufactured according to this process of the present invention is reduced over the cost of producing a prior art item. Bonding reliability is increased because of the increased surface area of the indium bump. The precision with which the bonding or hybridization process must be performed is reduced, thus potentially increasing the speed at which the hybridization process may be performed and permitting the use of less sophisticate positioning equipment.

Figure 3:
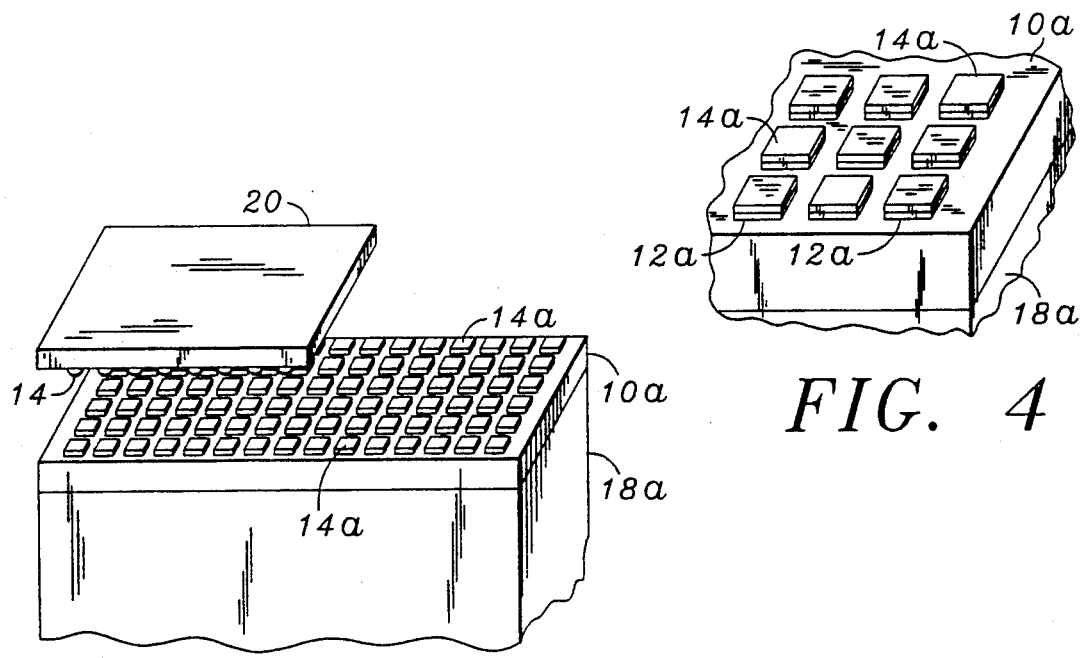
FIG. 3 is a perspective view of a detector array positioned for attachment to a signal processing module, the signal processing module having bump contacts formed thereupon according to the method of the present invention.

Referring now to FIG. 3, a hybridization process is illustrated wherein indium bumps 14a formed upon a substrate 10a accordingly to the method of the present invention provide electrical connection to an infrared detector array 20 having indium bumps 14 formed thereon according to a contemporary process. The indium contact bumps 14a formed upon the substrate 10a can be bonded to either indium contact bumps formed according to the process of the present invention or to prior art indium contact bumps.

The substrate 10a is disposed upon a module 18a which may house signal conditioning electronics or the like. Electrical connection of the infrared detector array 20 to the module 18a is accomplished by aligning the appropriate indium contact bumps 14 and 14a of the infrared detector array 20 and the module 18a, respectively, such that the desired electrical contact will be achieved when the indium contact bumps 14 and 14a are fused together. Pressure is used to fuse the malleable indium of the contact bumps 14 and 14a together. Thus, a permanent and reliable electrical connection is achieved.

Figure 4:
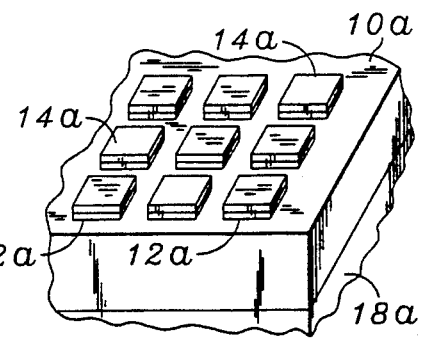
FIG. 4 is a enlarged perspective view of several of the signal processing module's bump contacts of FIG. 3.

Referring now to FIG. 4, an enlarged view of the indium contact bumps 14a and base pads 12a of the present invention is depicted. As illustrated in FIG. 4, each indium contact bump 14a has a generally square upper surface. Those skilled in the art will recognize that various shapes and configurations are possible.

Referring now to FIGS. 5A through 5I, the indium bump fabrication process of the prior art is depicted. The prior art process of forming indium contact bumps is illustrated herein to provide background against which the two embodiments of the process of the present invention may be contrasted.

Figure 5A:
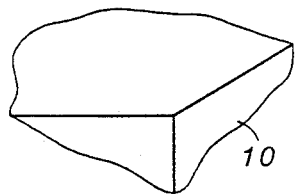
FIGS. 5A-5I depict the steps of the prior art process of forming bump contacts.

With particular reference to FIG. 5A, a substrate 10 upon which indium contact bumps will be formed is depicted. The substrate may be any suitable insulator upon which suitable conductive base pads may be formed. Those skilled in the art will recognize that undoped semiconductor materials such as single crystalline silicon are particularly suitable. Materials such as glass, ceramic, and sapphire provide examples of others materials which are likewise suitable.

Figure 5B:
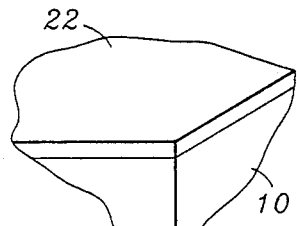

With particular reference to FIG. 5B, the substrate is first coated with a layer of a conductive metal 22. The base pads 12 will be formed from this conductive metal layer 22 using conventional photoresist techniques as discussed below.

Figure 5C:
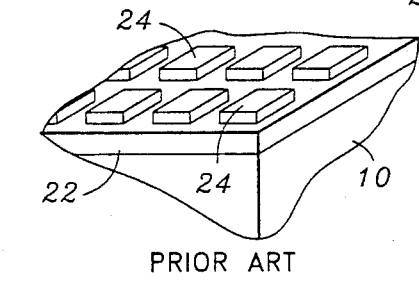

With particular reference to FIG. 5C, substantially square areas of photoresist 24 are formed upon the conductive metal base layer 22. Although not illustrated, this involves the conventional techniques of first covering the conductive metal base layer 22 with a layer of photoresist. A mask is next placed over the photoresist and exposed such that the squares 24 will harden and remain. Next the photoresist is washed from the areas between the layers 24, thus providing the configuration as illustrated in FIG. 5C. Since the positioning of the base pads 12 relative to the substrate is generally not critical, precise alignment of the mask in this step of the prior art process is not required.

Figure 5D:
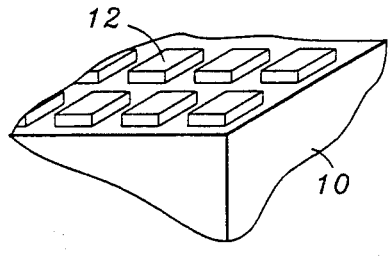

Referring now to FIG. 5D, the metal base layer 22 (as shown in FIGS. 5B and 5C) is etched to form metal base pads 12 and the photoresist (24 of FIG. 5C) is washed away. Thus, the square conductive metal base pads 12 are formed upon the surface of the substrate 10.

Figure 5E:
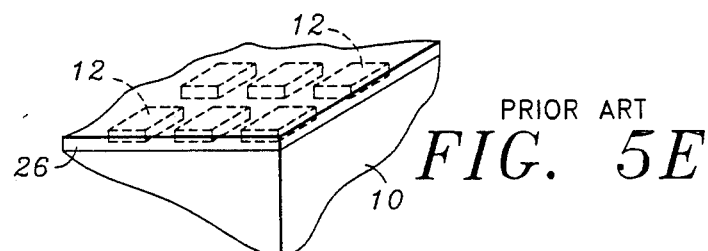

With particular reference to FIG. 5E, a layer of photoresist 26 is formed upon the surface of the substrate 10 such that the square conductive metal base pads 12 are covered.

Figure 5F:
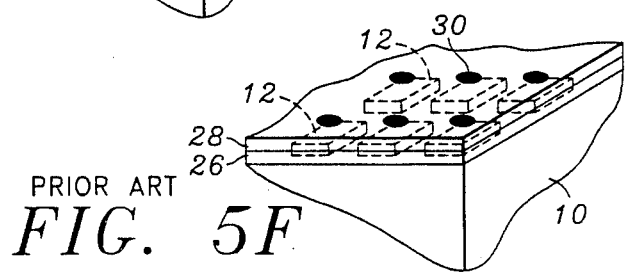

With particular reference to FIG. 5F, a mask 28 is aligned with the metal base pads 12 such that upon exposure, the photoresist 26 will harden and remain in place in all areas except for those areas directly beneath the dark circular images 30 where the indium bump connects are to be formed upon the base pads 12. Thus, alignment of the mask 28 such that the dark circular images 30 are centered above the conductive base pads 12 is crucial. This step must be performed such that the mask is precisely aligned to the base pads 12 within a tolerance of +/− 5 microns.

Figure 5G:
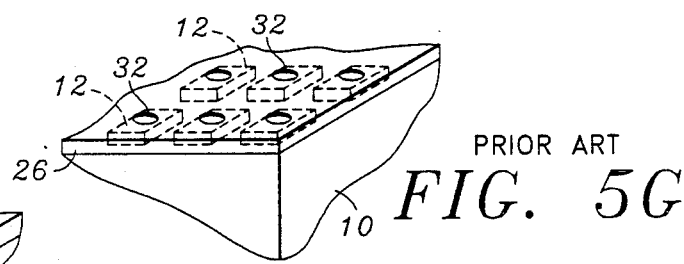

With particular reference to FIG. 5G, exposure and washing of the photoresist layer 26 results in uncovered areas or apertures 32 formed above the conductive base pads 12. The apertures 32 extend down to the upper surface of the base pads 12 such that indium contact bumps may be formed directly thereupon.

Figure 5H:
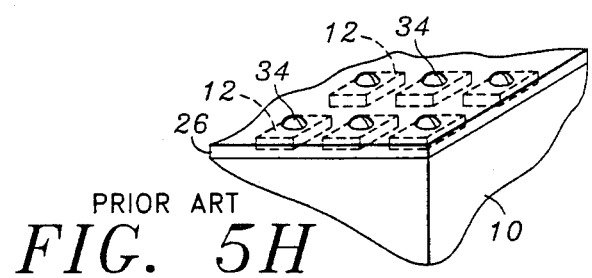

With particular reference to FIG. 5H, indium contact bumps 34 are formed upon the upper surfaces of the conductive base pads 12 by a conventional process such as electroplating or vapor deposition. Proper positioning of the indium bumps 34 upon the base pads 12 is dependent upon the proper location of the apertures 32 formed within the photoresist layer 26. Thus, any deviation in the alignment of the mask 28 as illustrated in FIG. 5F results in a corresponding deviation in the location of the indium bumps 34 relative to the base pads 12.

Figure 5I:
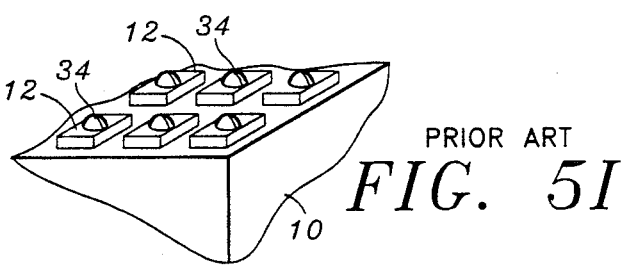

With particular reference to FIG. 5I, the photoresist layer 26 is washed away, thus leaving the indium bumps 34 formed upon the base pads 12. Each indium bump 34 covers only a portion of its corresponding base pad 12. Thus, the prior art process results in indium bumps 34 having less than an optimal surface area. The prior art process cannot be used to form bumps which cover a substantial portion of the upper surface of the base pad because of the precise alignment required to do so. That is, if the mask 28 of FIG. 5F were to define indium bumps which would substantially cover the upper surface of the base pads 12, it would then be necessary to precisely align the mask 28 such that there would be no overhang of the bumps thus formed upon the pads 12. The precision required to align a mask in order to form such contact bumps is impractical in a production environment.

This prior art method of forming indium contact bumps is relatively elaborate and requires two photoresist mask alignments. While the first alignment of the photoresist mask (which results in the photoresist squares of FIG. 5C) does not have to be performed with extreme precision, the second alignment (as illustrated in FIG. 5F) must be performed within extremely tight tolerances such that the resulting indium bumps 34 will be formed in the desired relative position to the base pads 12. If the dark circles 30 of the photoresist mask 28 are not positioned over the base pads 12, then the resulting indium bumps 34 will overhang the base pads.

Referring now to FIGS. 6A through 6D, the method for forming bump contacts upon a substrate according to the first embodiment of the present invention is illustrated. This method involves the use of a laser to delineate a layer of indium formed upon a layer of conductive base pad material such that the desired indium contact bumps are formed.

Figure 6A:
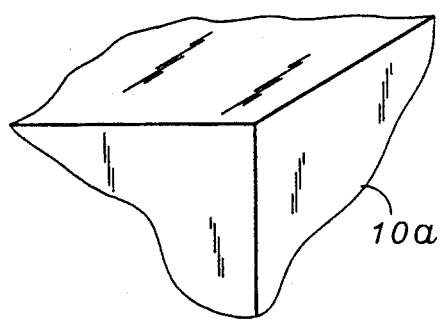
FIGS. 6A-6D depict the steps of forming bump contacts according to the first embodiment of the present invention.

With particular reference to FIG. 6A, a substrate 10 upon which indium contact bumps will be formed is depicted. As in the prior art, the substrate may be any suitable insulator upon which metal base pads may be formed. Materials such as glass, ceramic, and sapphire are examples of materials which are suitable.

Figure 6B:
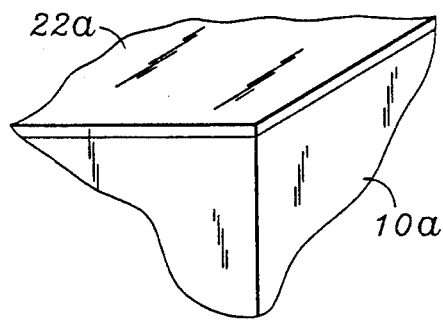

With particular reference to FIG. 6B, the substrate 10 is first coated with a layer of a conductive metal 22a. The layer of conductive metal 22a may be formed upon the substrate 10a by vapor deposition. Those skilled in the art will recognize that other methods are likewise suitable. The base pads 12a will be formed from this conductive metal layer 22a as discussed below.

Figure 6C:
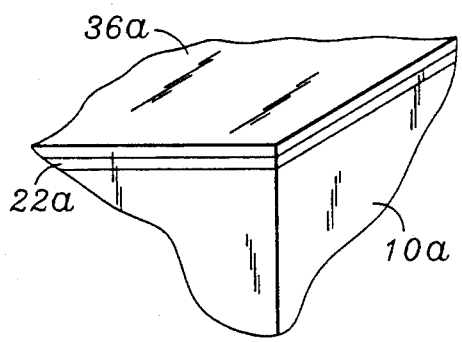

With particular reference to FIG. 6C, a layer of indium 36a is next formed upon the layer metal 22a. The layer of indium 36a may be formed upon the metal layer 22a by electroplating or vapor deposition. Those skilled in the art will recognize that other means for forming a layer of indium upon a metal layer are likewise suitable.

Figure 6D:
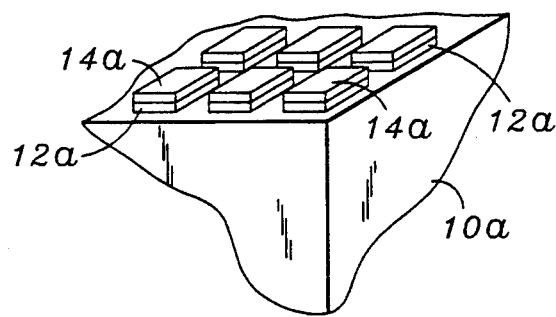

With particular reference to FIG. 6D, a laser or the like is used to selectively remove overlapping portions of the indium 36a and metal base layer 22a from the substrate 10a such that the remaining portions of the layers 36a and 22a define indium contact bumps 14a and metal base pads 12a. The surface area at the resulting second or indium 36a layer is substantially equal to the surface area of the first or base 22a layer.

The formation of generally square contact bumps 14a as illustrated in FIG. 6D simplifies the laser delineation process, however, those skilled in the art will recognize that many such shapes are likewise suitable. Also, those skilled in the art will recognize that other methods, such as mechanical scribing and ion milling, are likewise suitable for removing the undesirable portions of indium 10a and the metal base layer 22a.

Thus, the forming of bump contacts upon a substrate according to the first embodiment of the present invention greatly simplifies the fabrication process by reducing the number of steps and eliminating the need to precisely align a photoresist mask. Additionally, indium contact pads 14a are produced which provide an increased contact surface area and thus enhance the reliability of any connection formed therewith.

Referring now to FIGS. 7A through 7G, the method of forming bump contacts upon a substrate according to the second embodiment of the present invention is depicted. The method of second embodiment of the present invention involves the use of a single non-critically aligned photoresist mask to define the positioning and configuration of the metal base pads and indium contact bumps. Both the metal base pads and the indium contact bumps are formed within apertures formed within a single layer of photoresist.

Figure 7A:
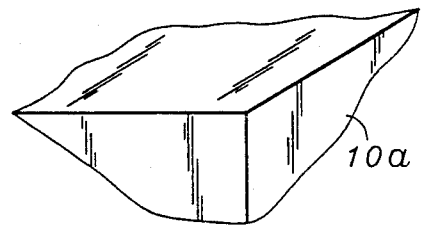
FIGS. 7A-7G depict the steps of forming bump contacts according to the second embodiment of the present invention.

With particular reference to FIG. 7A, a substrate 10 upon which indium contact bumps will be formed is depicted. The substrate may be any suitable insulator upon which metal base pads may be formed as in the method of the first embodiment of the present invention.

Figure 7B:
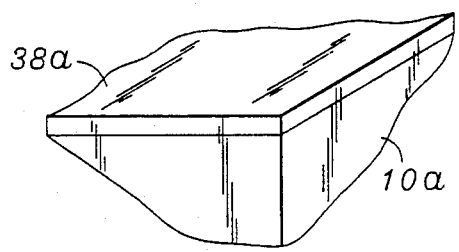

With particular reference to FIG. 7B, a layer of photoresist 38a is first formed upon the surface of the substrate 10a. This photoresist layer will be used as described below to define the size and configuration of the indium bumps and metal base pads.

Figure 7C:
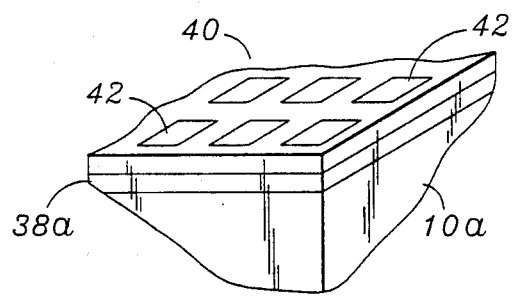

With particular reference to FIG. 7C, a mask 40 is placed upon the photoresist 38a to define the size and position of the metal base pads and indium bumps. The photoresist 38a is exposed through the mask 40 such that the substantially square areas of the photoresist 38a directly below the windows or apertures 42 in the mask 40 do not harden and can be washed away to form uncovered areas of the substrate. The remaining portion of the photoresist layer 38a hardens upon exposure.

Figure 7D:
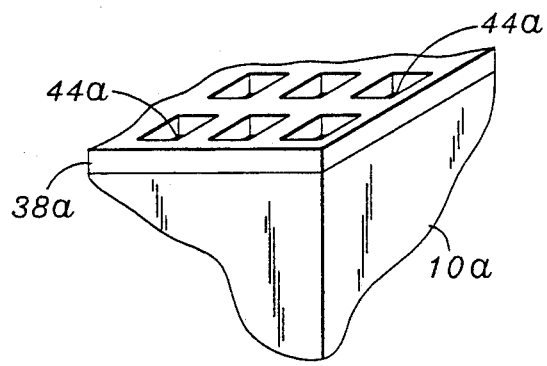

With particular reference to FIG. 7D, exposure and washing of the photoresist 38a results in the formation of apertures or uncovered areas 44a within the photoresist layer 38a. These uncovered areas 44a define the size and location of the metal base pads and indium bumps to be formed upon the substrate 10a. The surface of the substrate 10a is exposed in each uncovered area 44a such that base pads may be formed thereupon as described below.

Figure 7E:
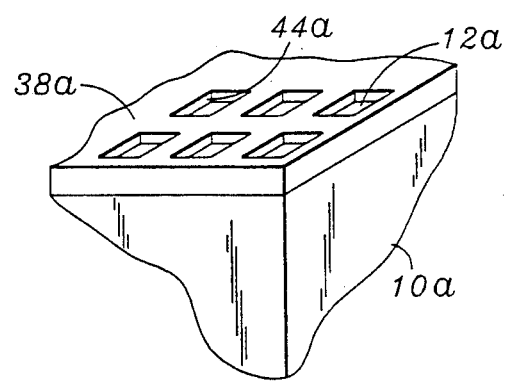

With particular reference to FIG. 7E, a layer of metal base pad material is formed within each of the uncovered areas 44a by electroplating, vapor deposition, or a similar process, such that base pads 12a are formed.

Figure 7F:
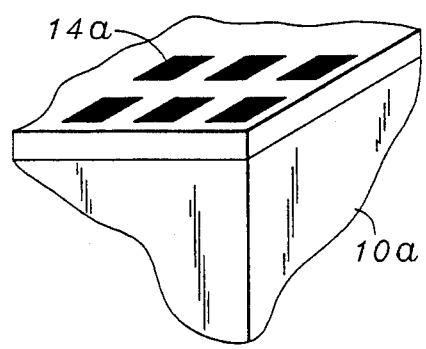

With particular reference to FIG. 7F, an indium layer 14a is formed upon each of the metal base pads 12a by electroplating, vapor deposition, or a similar process. At this point in the process the bump contacts are completely formed. They are therefore resistant to damage which could otherwise occur during photoresist liftoff. In the prior art, liftoff was performed on the base pads before formation of the malleable layer and resulted in frequent damage and consequently caused low process yields. In the present invention, the more delicate base pad 12a is protected by the malleable indium layer 14a, and therefore is much less susceptible to damage during liftoff or washing.

Figure 7G:
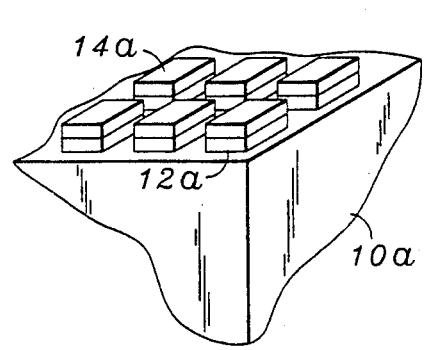

With particular reference to FIG. 7G, liftoff washing away the photoresist layer 38a exposes the remainder of the indium layer 14a and metal contact pads 12a.

Thus, the method for forming bump contacts upon a substrate according to the second embodiment of the present invention also greatly simplifies the process and likewise eliminates the need to precisely align a photoresist mask. Alignment of the single photoresist mask 40 as depicted in FIG. 7C of the second embodiment of the present invention is less critical than the alignment illustrated in FIG. 5F of the prior art method since alignment of the mask 40 in the method of the present invention is not required to define the position of the indium layer 14a upon the metal base pads 12a. Rather, alignment of the mask 40 in the method of the present invention is merely required to define the position of the completed indium bumps upon the substrate 10a. The precise positioning of the indium bumps upon the substrate 10a is not crucial. Thus, the two methods of the present invention provide a simplified means of forming indium contact bumps while increasing the yield of the process and lowering the cost per unit.

Additionally, the reliability of an interconnection utilizing the indium bumps formed according to the process of the present invention is improved. This improvement occurs because of the increased surface area of indium contact bumps formed accordingly the method of the present invention. The tolerance required for bump-to-bump alignment can thus be relaxed, permitting a simplified hybridization process and resulting in a higher hybridization yield. That is, the hybridization as illustrated in FIG. 3, for example, is performed more quickly and with a higher yield. The resulting interconnections provide increased reliability and electrical performance because of their increased surface area.

The probability of bump slipping is reduced considerably due to the increased surface area of indium bumps formed according to the method of the present invention. In both embodiments of the present invention the indium layer substantially covers the base pad layer such that the surface area of the indium layer is maximized. Bump slipping is common in the limited surface area prior art indium contacts. Slipping occurs when the bump contacts are slightly misaligned and force is then applied to fuse them together. Thus, alignment is both more critical and more difficult to achieve in the prior art. It is more critical since the bumps must be precisely aligned prior to fusing and it is more difficult because of the reduced surface area of the prior art bumps. The increased surface area of bumps formed according to the process of the present invention insures a better indium-to-indium contact. Increased surface area provides for better electrical and mechanical contact since the indium fuses along the increased surface area. Thus, the increased surface area of bump contacts formed according to the present invention makes them easier to align and also makes alignment less critical since slipping is avoided.

It is understood that the exemplary method described herein and shown in the drawings represents only a presently preferred embodiment. Indeed, various modifications and additions may be made to such embodiment without departing from the spirit and scope of the invention. For example, the shape and configuration of the bumps may be varied considerably without altering their function. Also, various means other than a laser scribing are contemplated for removing the undesired material in the first embodiment of the process of the present invention. For example, ion milling or mechanical scribing may be suitable. Additionally, malleable conductive materials other than indium may be used to form the bump contacts. Thus, these and other modifications and additions may be obvious to those skilled in the art and may be implemented to adapt the present invention for use in a variety of different applications.

What is claimed is:

1. A method for connecting an infrared detector array to signal conditioning electronics, the method comprising the steps of:
    a) forming an array of square multilayer bump contacts upon an insulating substrate, the step of forming the array comprising the steps of:
        i) forming a layer of resist material upon the insulating substrate, the layer of resist material defining an array of uncovered square area;
        ii) forming a conductive layer upon the resist layer and uncovered square areas;
        iii) forming a layer of indium upon the conductive layer;
        iv) removing the layer of resist and any of the conductive layer and indium layer formed upon the resist from the substrate, the remaining portions of the conductive layer and the indium layer defining an array of square bump contacts, the indium layer covering the conductive layer such that the surface area of the indium layer is equal to the surface area of the conductive layer;
        v) forming conductive conduits through the insulating substrate form providing electrical communication between the multilayer bump contacts and the signal conditioning electronics; and
    b) bump bonding hemispherical indium bump contacts formed upon the infrared detector array to corresponding square bump contacts formed upon the insulating substrate;
    c) wherein the bump bonding of the hemispherical indium bump contacts formed upon the infrared detector array to the corresponding square bump contacts formed upon the substrate mitigates the problem of misalignment by reducing the precision with which the infrared detector array and the array of multilayer bump contacts must be aligned during the bump bonding process.

2. The method as recited in claim 1 wherein the step of forming a layer of resist material comprises:
    a) depositing a photoresist material upon the substrate;

b) placing a mask over the photoresist material;
c) exposing said photoresist material through the mask such that portions of said photoresist material corresponding to the uncovered areas remain unhardened and portions of the photoresist material corresponding to areas adjacent the uncovered areas harden; and
d) washing the unhardened photoresist material off of the substrate.

* * * * *